United States Patent
Abel et al.

(10) Patent No.: US 10,727,046 B2
(45) Date of Patent: Jul. 28, 2020

(54) SURFACE MODIFIED DEPTH CONTROLLED DEPOSITION FOR PLASMA BASED DEPOSITION

(71) Applicant: Lam Research Corporation, Fremont, CA (US)

(72) Inventors: Joseph Abel, West Linn, OR (US); Adrien Lavoie, Newberg, OR (US); Purushottam Kumar, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/029,466

(22) Filed: Jul. 6, 2018

(65) Prior Publication Data

US 2020/0013616 A1    Jan. 9, 2020

(51) Int. Cl.
| | | |
|---|---|---|
| C23C 16/02 | (2006.01) | |
| C23C 16/34 | (2006.01) | |
| C23C 16/455 | (2006.01) | |
| H01L 21/02 | (2006.01) | |
| H01J 37/32 | (2006.01) | |

(52) U.S. Cl.
CPC .... *H01L 21/02274* (2013.01); *C23C 16/0245* (2013.01); *C23C 16/345* (2013.01); *C23C 16/45565* (2013.01); *H01J 37/3244* (2013.01); *H01J 37/32082* (2013.01)

(58) Field of Classification Search
CPC ...... C23C 16/40; C23C 16/401; C23C 16/402
See application file for complete search history.

(56) References Cited

U.S. PATENT DOCUMENTS

| | | | |
|---|---|---|---|
| 8,877,655 B2 | 11/2014 | Shero et al. | |
| 2015/0243545 A1* | 8/2015 | Tang | H01L 21/76224 438/430 |
| 2017/0040214 A1* | 2/2017 | Lai | H01L 21/32136 |
| 2017/0053811 A1* | 2/2017 | Fung | H01L 21/32136 |

FOREIGN PATENT DOCUMENTS

| | | |
|---|---|---|
| KR | 20140128347 A | 11/2014 |
| WO | 2011072143 A2 | 6/2011 |
| WO | 2016204771 A1 | 12/2016 |

OTHER PUBLICATIONS

Notification of Transmittal of the International Search Report and the Written Opinion of the International Searching Authority issued in International Application No. PCT/US2019/038589, dated Oct. 15, 2019 (Forms PCT/ISA/220, 210,237) (14 total pages).

* cited by examiner

*Primary Examiner* — Dah-Wei D. Yuan
*Assistant Examiner* — Nga Leung V Law
(74) *Attorney, Agent, or Firm* — Penilla IP, APC

(57) ABSTRACT

A method for performing gap fill of a feature on a substrate includes the following operations: (a) moving the substrate into a process chamber; (b) performing a plurality of cycles of an ALD process; (c) purging process gases from the ALD process from the process chamber; (d) performing a plasma treatment on the substrate by introducing a fluorine-containing gas into the process chamber and applying RF power to the fluorine-containing gas to generate a fluorine plasma in the process chamber; (e) purging process gases from the plasma treatment from the process chamber; (f) repeating operations (b) through (e) until a predefined number of cycles has been performed.

20 Claims, 12 Drawing Sheets

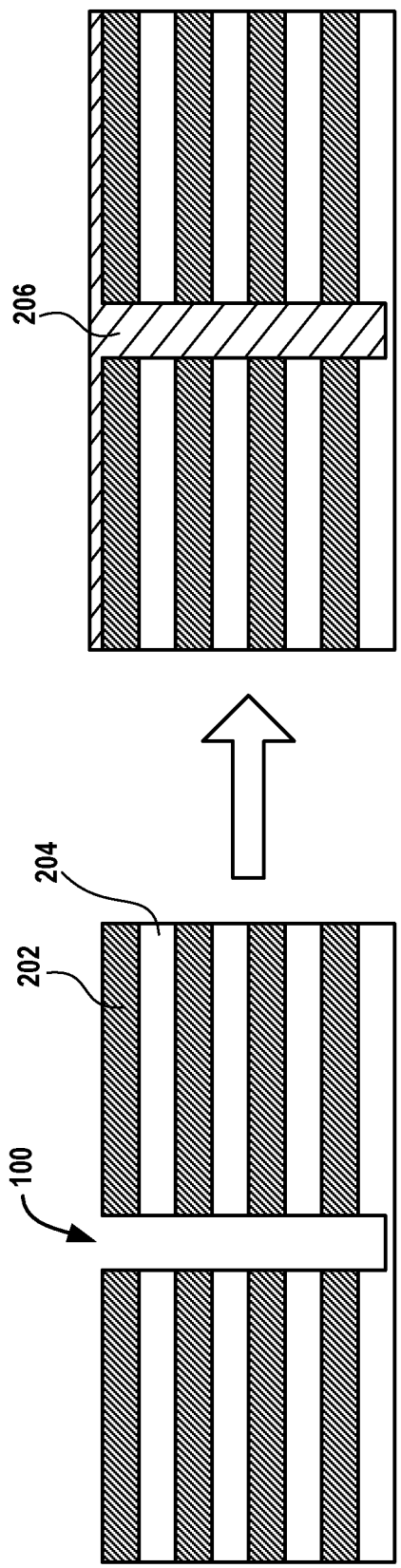

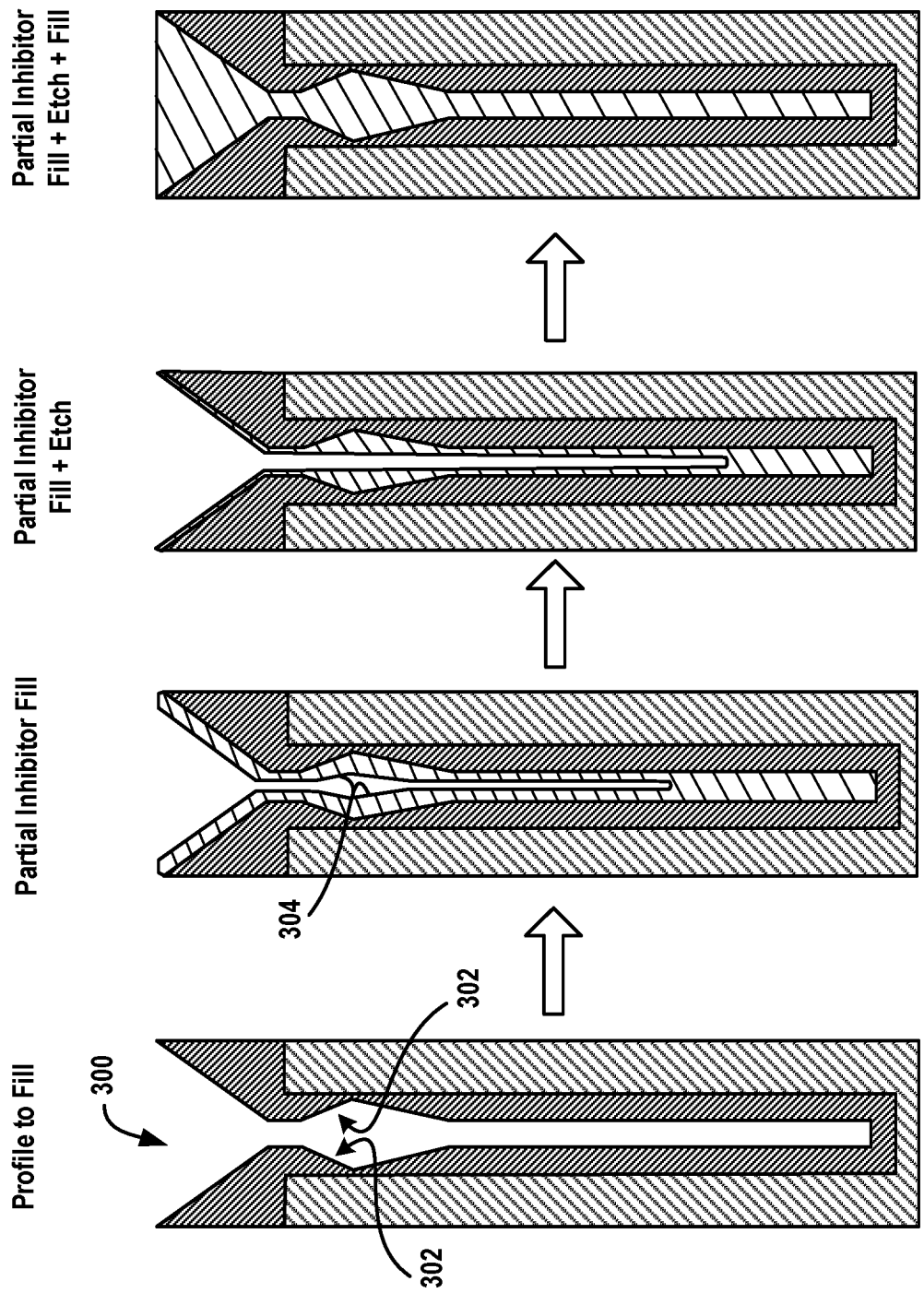

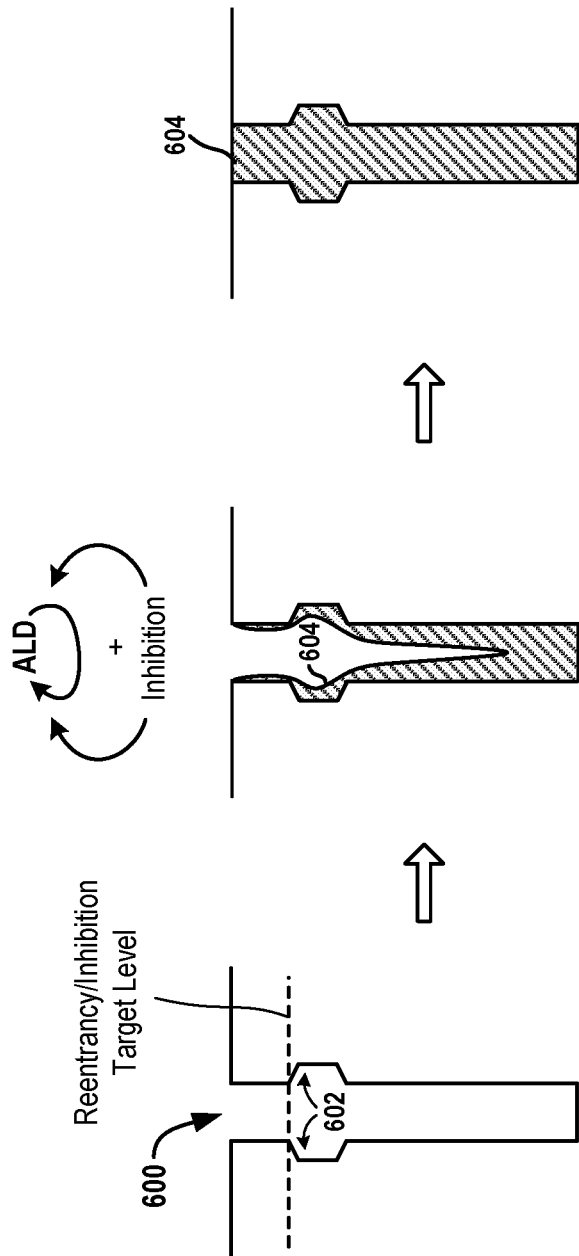

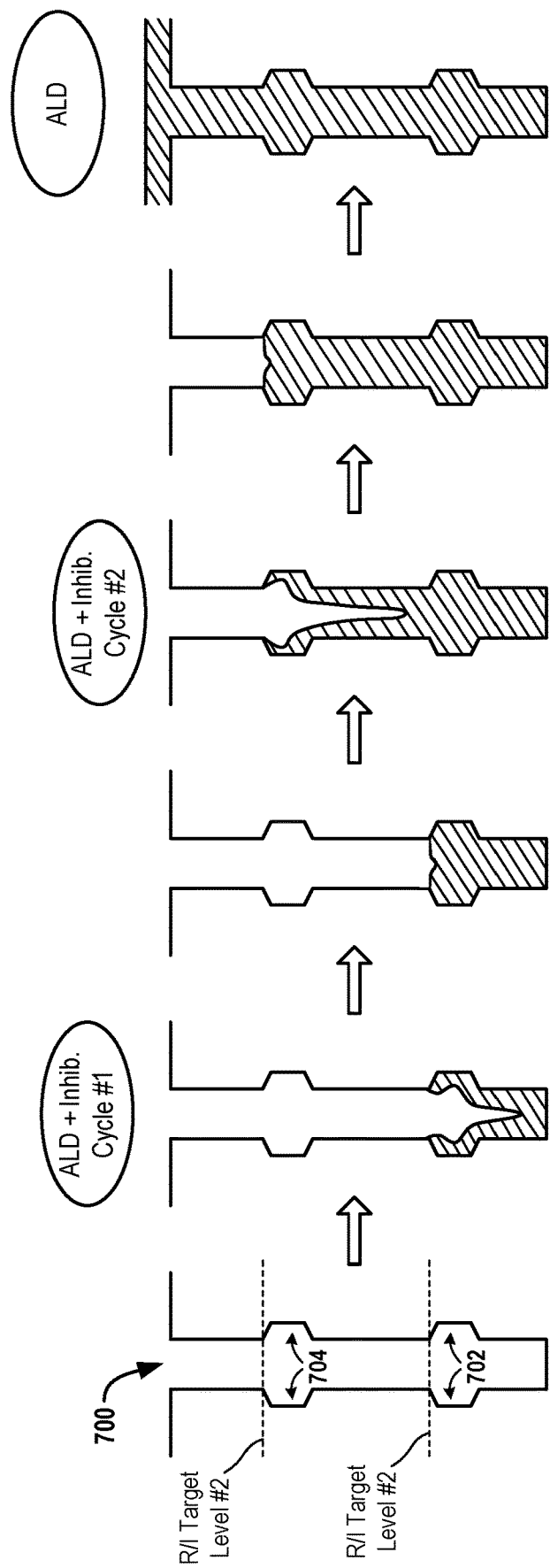

SURFACE MODIFIED DEPTH CONTROLLED DEPOSITION FOR PLASMA BASED DEPOSITION

BACKGROUND

Deposition-etch-deposition (DED) has been demonstrated to fill high aspect ratio vias, holes, and trenches. The DED method encounters gap fill limitations when utilized to fill features with increased reentrancy below the top of the structure. Structures that have a largely reentrant feature compared with the opening dimension or any large reentrant feature compared to the bulk opening do not allow enough material to be grown in the line of sight of the ions for the etch before the features pinch off.

It is in this context that implementations of the disclosure arise.

SUMMARY

In some implementations, a method for performing gap fill of a feature on a substrate is provided, including: (a) moving the substrate into a process chamber; (b) performing a plurality of cycles of an ALD process; (c) purging process gases from the ALD process from the process chamber; (d) performing a plasma treatment on the substrate by introducing a fluorine-containing gas into the process chamber and applying RF power to the fluorine-containing gas to generate a fluorine plasma in the process chamber; (e) purging process gases from the plasma treatment from the process chamber; (f) repeating operations (b) through (e) until a predefined number of cycles has been performed.

In some implementations, the fluorine plasma passivates a portion of the feature on the substrate, thereby inhibiting deposition by the ALD process over the portion of the feature that is passivated.

In some implementations, the portion of the feature that is passivated extends from a top of the feature down to a predefined target level in the feature.

In some implementations, the predefined target level is controlled by one or more parameters of the plasma treatment.

In some implementations, the parameters of the plasma treatment include one or more of the following: a duration of the plasma treatment, a temperature of the plasma treatment, a pressure of the fluorine-containing gas, and a level of the RF power.

In some implementations, the feature includes a reentrancy, and wherein the predefined target level is defined approximately at a level of the reentrancy, so that deposition by the ALD process is substantially inhibited above the level of the reentrancy by the plasma treatment.

In some implementations, the fluorine plasma passivates the portion of the feature by forming fluorine terminated species along surfaces of the portion of the feature.

In some implementations, the method further includes: (g) performing one or more cycles of the ALD process.

In some implementations, the predefined number of cycles of operation (e) is configured to effect gap fill so as to remove a reentrancy in the feature.

In some implementations, the one or more cycles of the ALD process of operation (g) are configured to complete the gap fill of the feature.

In some implementations, the ALD process is configured to deposit an oxide in the feature of the substrate.

In some implementations, the fluorine-containing gas is $CH_3F$, $CHF_3$, $CF_4$, $C_2H_4F_2$, $C_2H_2F_4$, $C_3H_2F_6$, $C_4H_2F_8$, $C_4F_8$, $NF_3$, or $SF_6$.

In some implementations, a method for performing gap fill of a feature on a substrate is provided, including: (a) moving the substrate into a process chamber; (b) performing a plurality of cycles of an ALD process, the ALD process being configured to deposit an oxide in the feature of the substrate; (c) purging process gases from the ALD process from the process chamber; (d) performing a plasma treatment on the substrate by introducing a fluorine-containing gas into the process chamber and applying RF power to the fluorine-containing gas to generate a fluorine plasma in the process chamber; (e) purging process gases from the plasma treatment from the process chamber; (f) repeating operations (b) through (e) until a predefined number of cycles has been performed; (g) performing a plurality of cycles of the ALD process.

In some implementations, the fluorine plasma passivates a portion of the feature on the substrate, thereby inhibiting deposition by the ALD process over the portion of the feature that is passivated.

In some implementations, the portion of the feature that is passivated extends from a top of the feature down to a predefined target level in the feature.

In some implementations, the predefined target level is controlled by one or more parameters of the plasma treatment.

In some implementations, the parameters of the plasma treatment include one or more of the following: a duration of the plasma treatment, a temperature of the plasma treatment, a pressure of the fluorine-containing gas, and a level of the RF power.

In some implementations, a method for performing gap fill of a feature on a substrate is provided, including: (a) moving the substrate into a process chamber; (b) performing a plurality of cycles of an ALD process; (c) purging process gases from the ALD process from the process chamber; (d) performing a plasma treatment on the substrate by introducing a fluorine-containing gas into the process chamber and applying RF power to the fluorine-containing gas to generate a fluorine plasma in the process chamber, the RF power being applied at a frequency in the range of approximately 200 to 600 kHz; (e) purging process gases from the plasma treatment from the process chamber; (f) repeating operations (b) through (e) until a predefined number of cycles has been performed.

In some implementations, a pressure of the plasma treatment is in the range of about 0.5 to 8 Torr.

In some implementations, a duration of the plasma treatment is in the range of about 0.1 to 3 seconds.

Other aspects and advantages of the disclosures herein will become apparent from the following detailed description, taken in conjunction with the accompanying drawings, which illustrate by way of example the principles of the disclosures.

BRIEF DESCRIPTION OF THE DRAWINGS

FIG. 18 is a simplified schematic diagram of a computer system for implementing implementations of the present disclosure.

FIGS. 2A and 2B illustrate a gapfill application on a multilaminate stack, in accordance with implementations of the disclosure.

FIGS. 3A, 3B, 3C, and 3D illustrate an inhibition based technique for achieving gapfill of a reentrant feature.

FIGS. 6A, 6B, and 6C conceptually illustrate a cross-section of a feature on a substrate and demonstrate a gapfill process in accordance with implementations of the disclosure.

FIGS. 7A to 7F illustrate a cross-section of a feature having multiple reentrancies, demonstrating a process for gapfill in accordance with implementations of the disclosure.

DETAILED DESCRIPTION

In the following description, numerous specific details are set forth in order to provide a thorough understanding of the example implementations. However, it will be apparent to one skilled in the art that the example implementations may be practiced without some of these specific details. In other instances, process operations and implementation details have not been described in detail, if already well known.

As used herein, the terms "about" and "approximately" mean that the specified parameter can be varied within a reasonable tolerance, e.g., ±10% in some implementations, ±15% in some implementations, or ±20% in some implementations.

Broadly speaking, implementations of the present disclosure provide methods, systems, and apparatus that enable dielectric gap fill on high aspect ratio features with large reentrant structures inside a hole or trench. In some implementations, disclosed techniques utilize a surface modified with fluorine by use of low frequency (LF; e.g. 200 to 600 Hz) and high frequency (HF; e.g. 13 to 14 MHz) plasma. The surface modification allows controlled depth of deposition within features during the growth process. The fluorine surface treatment may be applied to gap fill of vias, holes, shallow trench isolation (STI) structures and trenches on multi-laminate stacks (not simply a feature that is fabricated in a single material), including though not limited to various materials including silicon/polysilicon, silicon dioxide, germanium, nitrides, oxides, or multilaminate stack materials. The modification allows multiple plasma cycles to be performed before re-application of the surface modification is necessary.

Generally speaking, a reentrant feature is a feature that exhibits a sidewall profile wherein some portion of the sidewall is laterally etched/removed to a greater extent than another portion immediately above at a shallower depth. The first portion is thus said to be "shadowed" by the second portion at the shallower depth. A reentrant feature typically results from the etch process deviating from a straight line, producing undercutting or shadowing, and the area where this occurs is a reentrancy. This can occur anywhere inside a feature. There can be various sources of reentrant features. For example, during an etch process, there may be passivation of the sidewalls, and if the passivation changes or is inconsistent, there may be bowing in some areas due to inconsistent etch along the sidewalls. In some cases, there are layers of different materials, which may be etched at different rates, causing the resulting sidewall etch profile to exhibit bulges due to the different etch rates of the materials.

Figure 1C:
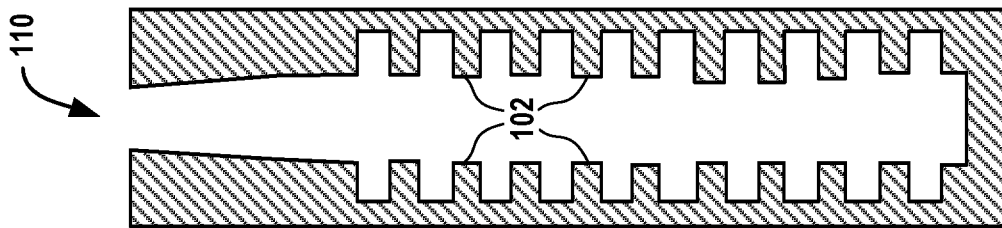
FIGS. 1A, 1B, and 1C conceptually illustrate cross-section views of features exhibiting reentrancy, in accordance with implementations of the disclosure.
Figure 1B:
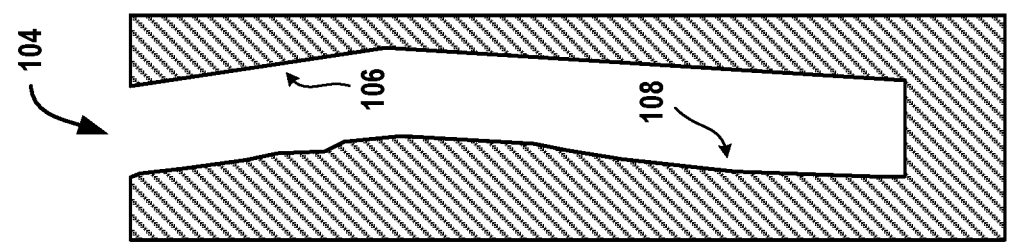
Figure 1A:
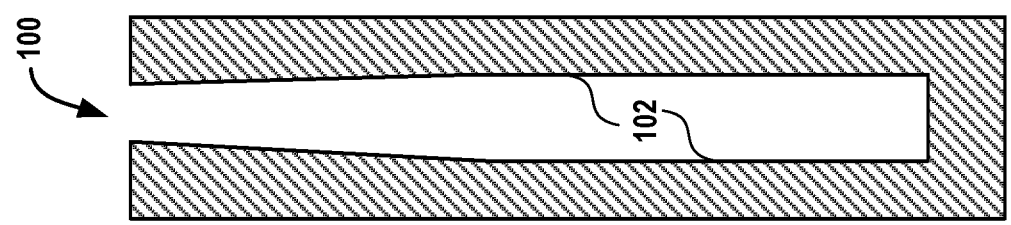

FIGS. 1A, 1B, and 1C conceptually illustrate cross-section views of features exhibiting reentrancy, in accordance with implementations of the disclosure. For example, as shown at FIG. 1A, some reentrancy manifests as a feature 100 that is smaller at the top and flared out (larger) at the bottom. This is sometimes described as sidewalls 102 having a negative sloping or tapering. In some processes, there are two-tiered etches, which can produce a reentrancy at the top and a reentrancy somewhere in the middle of the feature, for example.

As demonstrated at FIG. 1B, in some instances, a reentrancy can emerge due to bending in a line feature 104. For example, such bending may be produced by an inappropriate etch or stress in the film. The bending causes one side of the feature to be reentrant relative to the opposite side. It will be appreciated that in the illustrated implementation, the back and forth bending of the feature 104 produces a reentrancy 106 along one side in an upper region of the feature 104, and another reentrancy 108 along the opposite side in a lower region of the feature 104.

As illustrated at FIG. 1C, another example of reentrancy is due to sidewall topography of the feature 110. By way of example without limitation, this may occur in NAND devices, FINFET devices, oxide/nitride (ONON) stacks, oxide/polysilicon (OPOP) stacks, etc. For example, sidewalls may have fins 112 or other features that produce reentrancy in the feature.

The ability of an etch process to remove unwanted reentrancy and sidewall profiles for gapfill can be dependent on incoming structures. Structures that have "necking" features or reentrant portions within the structure can pinch off before the etch portion of DED can remove deposited material causing the pinching.

FIGS. 2A and 2B illustrate a gapfill application on a multilaminate stack, in accordance with implementations of the disclosure. By way of example without limitation, the multilaminate stack can be an ONON or OPOP material stack. In the illustrated implementation, a first material 202 layer alternates with a second material 204 layer to form the multilaminate stack. When etching multilaminate stacks such as these, there is often reentrancy involved, which causes undercutting in sections. For example, the first material 202 might etch at a slower rate than the second material 204, so that along the sidewalls of the feature 200, the layers of the second material 204 become recessed as compared to the layers of the first material 202.

FIG. 2B illustrates the gapfill 206 deposited into the feature 200. With normal gapfill processes (e.g. atomic layer deposition (ALD) or otherwise) when deposition is performed in those areas, the reentrancies can become voids.

FIGS. 3A, 3B, 3C, and 3D illustrate an inhibition based technique for achieving gapfill of a reentrant feature. As shown at FIG. 3A, a feature 300 may have a reentrancy 302. In the illustrated example, the reentrancy 302 is shown at the top of the feature 300, but in various features reentrancies can occur anywhere from the top to the bottom of the feature. Anywhere such reentrancies exist, they can become voids upon gapfill.

With existing technology, an inhibitor fill process can be applied using an inhibitor such as nitrogen ($N_2$) plasma. Such processes aim to inhibit the growth and fill at a differential rate so that the deposition at the bottom of the feature grows at a faster rate than the top, which allows growth within the re-entrancy faster before it pinches off. That is, an inhibitor is applied with each ALD cycle so that deposition rates towards the top of the feature are reduced.

In some cases, the inhibitor fill process is performed for multiple cycles until a certain thickness is achieved, resulting in a partial inhibitor fill layer 304 as shown at FIG. 3A. Optionally, then an etch step can be performed to remove material as shown at FIG. 3C. This is then followed by a fill process with normal ALD (without the inhibitor) to complete the gapfill of the feature, as shown at FIG. 3D.

However, a problem with the above-described inhibitor fill process is that the inhibitor must be applied with each ALD cycle of the flow. Every time material is deposited in a cycle, application of the inhibitor is required, which is a lengthy additional step and therefore becomes a very slow process. By way of example without limitation, for an inhibitor fill process using an inhibitor such as nitrogen ($N_2$) plasma, the ALD cycle by itself may be on the order of 1.5 seconds; however, an extra 20 seconds may be required with every cycle in order to perform the $N_2$ plasma inhibition. Thus, the deposition cycle time may increase from a 1.5 second cycle time to a 21.5 second cycle time. The growth rate may be normally about 0.8 angstroms per second, and a typical desired thickness may be approximately 200 angstroms, and thus the number of cycles is typically on the order of about 200-300 cycles. Thus, the increased cycle time is magnified and the reduction in throughput because of the inhibition process can be very significant. The purpose of the etch step is to try and make the process faster by enabling the fill procedure to switch back to normal ALD without risk of pinch off. Thus, an existing procedure might entail an inhibitor fill process (e.g. 20 to 25 second cycles, which is a very slow fill) until the reentrancy is filled to the point where there is no longer shadowing, then perform a long etch (e.g. approximately 30 seconds), and then switch to regular ALD deposition to complete the fill. However, while the etch back and switch to regular ALD fill can help throughput, the overall process is still very significantly impeded due to the inhibition portion of the inhibitor fill process.

However, in accordance with implementations of the present disclosure, an inhibitor is used such that the inhibition effect can survive multiple iterations of the ALD plasma cycle. This enables multiple ALD cycles to be performed in succession without the need to re-apply the inhibitor. Previously applied inhibitors did not survive multiple ALD cycles. However, implementations of the present disclosure provide inhibitors that are capable of providing an inhibition effect that lasts for multiple ALD cycles.

In some implementations, a fluorinated gas is utilized to treat the substrate surface and provide an inhibition effect. Broadly speaking, a process flow may entail performance of multiple ALD cycles, then purging of the ALD gases, then application of a fluorinated gas to treat the surface; this process is repeated for multiple iterations. The fluorinated gas provides an inhibition effect that persists for multiple ALD cycles so that it need not be re-applied with every ALD cycle.

It is noted that fluorinated gases are not normally used in deposition processes, but rather tend to be used in etch processes. Use of fluorinating agents during chamber cleaning processes is known. However, in such cases, the purpose of the fluorine is to effect cleaning and to be removed. Whereas, in accordance with implementations of the present disclosure, fluorine is used to persist selectively in certain areas of the substrate and thereby provide an inhibition effect during gapfill deposition.

Figure 4:
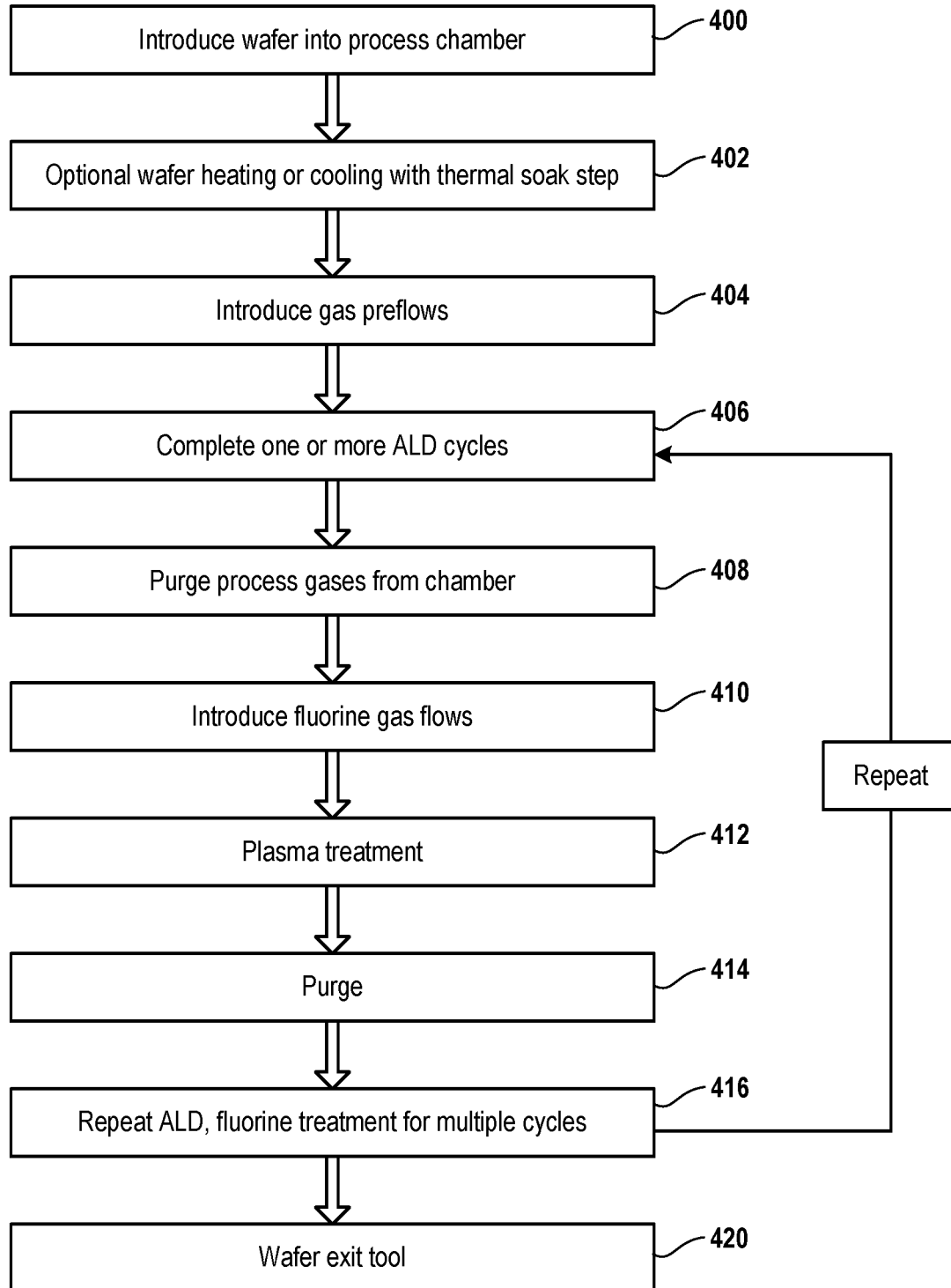
FIG. 4 illustrates a method for performing gapfill process with a fluorine plasma inhibition, in accordance with implementations of the disclosure.

FIG. 4 illustrates a method for performing gapfill process with a fluorine plasma inhibition, in accordance with implementations of the disclosure. At method operation 400, a wafer (substrate) is introduced into a process chamber. At method operation 402, optionally, wafer heating or cooling with a thermal soak step can be performed to bring the wafer to a desired temperature. At method operation 404, gas preflows for ALD are introduced. For example, this can include flowing an inert gas into the process chamber and equilibrating the gas flow in and out of the process chamber.

At method operation 406, one or more ALD cycles are performed. Each ALD cycle typically consists of a dosing of a first reactant, a first purge, a dosing of a second reactant, and a second purge. In some implementations, the dosing of the first or second reactant can also be a plasma process. Following completion of the ALD cycles, then at method operation 408, all process gases from the ALD are purged from the process chamber (e.g. using an inert gas). It will be appreciated that the specific number of ALD cycles performed at method operation 406 can vary depending upon the application, the dimensions of the feature to be filled and any reentrancies therein. In some implementations, the number of ALD cycles is in the range of approximately 5 to 25 cycles; in some implementations, in the range of approximately 10 to 20 cycles; in some implementations, in the range of approximately 10 to 15 cycles.

At method operation 410, a fluorine-containing gas is introduced into the process chamber. At method operation 412, RF power is applied to the process chamber to generate a plasma from the fluorine-containing gas, and thus a fluorine plasma treatment is effected. Following the plasma treatment, then at method operation 414 the process chamber is purged. At method operation 416, if a predefined number of cycles has not been reached, then the method returns to method operation 406. And thus the cycle of ALD deposition and fluorine plasma treatment is repeated until the predefined number of cycles is reached.

Upon completion of the predefined number of cycles, then at method operation 420 the wafer exits the process tool.

Optionally in some implementations, following the completion of the predefined number of cycles at method operation 416, an additional predefined number of ALD cycles is performed (without performance of the inhibition treatment of method operations 410, 412, and 414). This can be useful where the ALD+inhibition treatment cycles of method operations 406 to 416 are sufficient to achieve deposition up to the level of a reentrancy so that the reentrancy is removed (or sufficiently reduced), such that regular ALD gapfill can then be employed to fill the remainder of the feature.

The process parameters for the fluorine plasma treatment can vary in accordance with various implementations of the disclosure. In some implementations, a dual frequency RF power is applied, combining a relatively low frequency (LF; e.g. produced by a LF generator) and a relatively high frequency (HF; e.g. produced by a HF generator) of RF power. In some implementations, the low frequency is in the range of about 400 to 430 kHz. In some implementations, the frequency is in the range of about 200 to 600 kHz. In some implementations, the high frequency is in the range of about 13 to 14 MHz. In some implementations, the high frequency range can extend from about 10 to 120 MHz. In some implementations, the high frequency is 13.56 MHz.

In some implementations, the power for the fluorine plasma treatment is in the range of about 500 to 2500 Watts. In some implementations, the power is in the range of about 50 Watts to 5 kW. Generally speaking, increasing the power is associated with an increase in the inhibition effect that extends deeper within a feature.

In some implementations, the temperature for the fluorine plasma treatment is in the range of about 75 to 550 degrees Celsius. In some implementations, the temperature is in the range of about 20 to 800 degrees Celsius. It will be appreciated that the optimal temperature may depend upon the particular application, and for example, what circuits are already in place on a given substrate/wafer. For example, a higher temperature may be utilized at lower levels, whereas a lower temperature may be utilized at higher levels to protect existing structures.

In some implementations, the pressure of the fluorine plasma treatment is in the range of about 0.5 to 8 Torr. Broadly speaking, increasing the pressure is correlated with a greater inhibition effect that extends deeper into a feature.

In some implementations, the time of the fluorine plasma treatment is in the range of about 0.1 to 3 seconds. Generally speaking, increasing the time is associated with an increase in the inhibition effect that extends deeper within a feature.

Additionally, increasing the flow of the fluorine-containing gas can cause an increase in the inhibition effect.

In view of the above, it will be appreciated that the parameters of the ALD+plasma inhibition treatment cycle defined by method operations 406 to 416 may vary from one cycle to the next or from one set of cycles to the next, so as to optimize the amount and level of inhibition effect in view of the structure of the feature including the depth and severity of any reentrancies, and the change in the profile or structure of the feature as the fill process progresses.

For example, in some implementations, the method operations 406 to 416 are performed for a first number of cycles using a first set of parameters so as to target filling a feature up to a level of a first reentrancy, following which the method operations 406 to 416 are performed for a second number of cycles using a second set of parameters so as to target filling the feature up to a level of a second reentrancy. It will be appreciated that this concept can be extended to target filling up to the levels of additional reentrancies, and may optionally be followed by ALD fill without the inhibition treatment as described above.

In some implementations, the parameters of the fluorine plasma inhibition treatment can be gradually changed over the course of multiple ALD+inhibition treatment cycles. In some implementations, the fluorine plasma inhibition treatment can be gradually phased out over such a number of cycles, so that the effect and depth of the inhibition is gradually reduced.

Figure 5B:
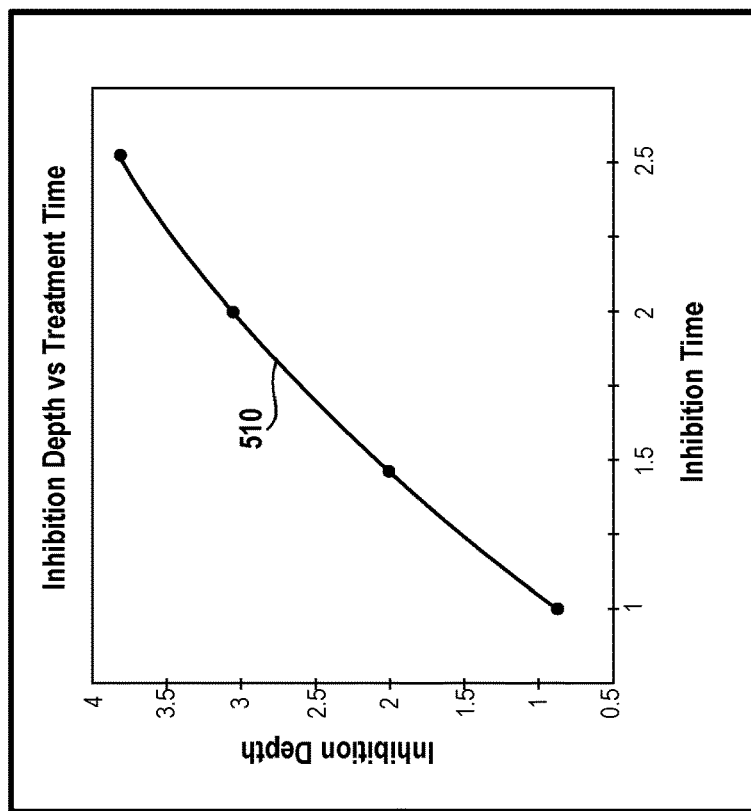
FIG. 5B is a graph illustrating the depth of inhibition versus the inhibition treatment time, in accordance with implementations of the disclosure.
Figure 5A:
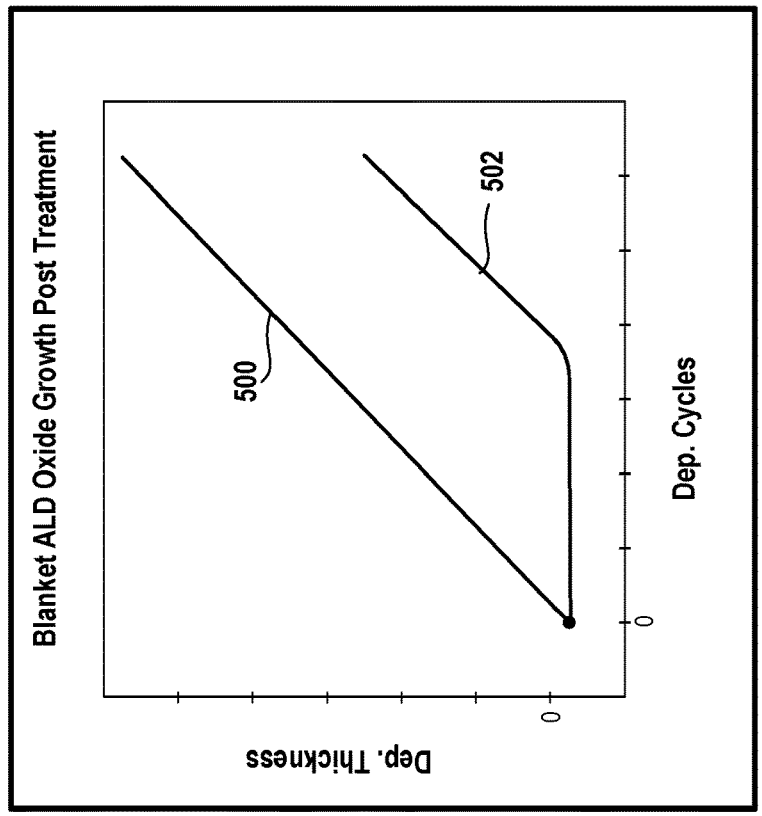
FIG. 5A is a graph demonstrating the effect of the inhibition treatment on subsequent deposition cycles, in accordance with implementations of the disclosure.

FIG. 5A is a graph demonstrating the effect of the inhibition treatment on subsequent deposition cycles, in accordance with implementations of the disclosure. The illustrated graph shows deposition thickness versus the number of ALD cycles. The curve 500 shows the case where no inhibition treatment is performed, and demonstrates deposition thickness increasing approximately linearly with increasing numbers of ALD deposition cycles. The curve 502 shows deposition thickness following a fluorine plasma inhibition treatment in accordance with implementations of the disclosure. As demonstrated by curve 502, the deposition thickness does not increase for a certain number of cycles following the inhibition treatment, and thus the ALD deposition is inhibited during these cycles. Following this, as the number of ALD cycles further increases, eventually the deposition thickness increases, indicating that the inhibition effect of the inhibition treatment wears off.

By way of example without limitation, the curve 502 may correspond to a 1 second application of inhibitor, and approximately no growth may occur until about 15 cycles after inhibitor application. So this demonstrates inhibition (e.g. at the top of the feature) for an extended number of cycles.

FIG. 5B is a graph illustrating the depth of inhibition versus the inhibition treatment time, in accordance with implementations of the disclosure. As demonstrated by the curve 510, as the duration of the fluorine plasma inhibition treatment increases, so the depth to which the inhibition effect extends also increases, within a feature. The illustrated graph is representative of a straight-walled feature, and as shown, for such a feature the effect is approximately linear, such that inhibition depth increases approximately linearly with fluorine plasma treatment time. It will be appreciated that the effect may not be linear for other types of feature contours.

As demonstrated, by adjusting certain parameters such as the duration of the fluorine plasma inhibition treatment, it is possible to adjust the amount and depth of inhibition and thereby target where deposition growth is permitted within a feature. Thus, timing (or another adjustable parameter) can be utilized to target a reentrancy, so that growth is inhibited down to the level of the reentrancy, yet below the level of the reentrancy normal ALD growth occurs. For a reentrancy positioned at a shallower depth, one could use a shorter inhibition treatment time. Whereas for a reentrancy that is positioned at a deeper depth, a longer time could be used to target the reentrancy and stop the ALD growth down to the level of the reentrancy. So depending on the depth of the reentrancy, one can target the reentrancy by using a shorter time for an upper reentrancy, or a longer time for a lower reentrancy.

It is noted that the inhibition effect provided by the fluorine plasma treatment provided in accordance with implementations of the disclosure persists for multiple ALD cycles, unlike prior art inhibition techniques. Without being bound by theory, it is hypothesized that in the plasma there is initially a fluorine containing gas, and a bond may be homolyzed to generate a fluorine localized radical. And since the free radicals are highly reactive, there is enhanced reactivity of the fluorine radical to the substrate. Thus, it is theorized that there may be not only physisorption, but also chemisorption with a terminated fluorine species. This yields a very inert surface structure that withstands multiple ALD cycles.

Additionally, it is noted that some etch may result from the fluorine plasma inhibition treatment. And thus, it is theorized that the plasma treatment may also achieve selective deposition by selectively etching to a certain depth within a feature.

It will be appreciated that the techniques disclosed herein are applicable for gapfill applications in trenches (STI), holes, vias, etc. By way of example without limitation, materials deposited can include nitrides, oxide, polysilicon, silicon, etc. By way of example without limitation, techniques disclosed herein may be useful in the processes for creating NAND devices, DRAM, logic, STI, horizontal gapfill, vertical gapfill, etc.

Techniques in accordance with implementations of the disclosure provide great improvement in throughput while enabling complete gapfill of reentrant structures without pinch-off or void formation. For dealing with a reentrancy at the top of a feature, a prior deposition technique required performance of a very lengthy inhibitor-fill (e.g. 20-25 second cycles, inhibitor treatment performed with each ALD cycle); and then when the gapfill reached a point of no longer shadowing in the feature, then a long etch (e.g. 30 seconds) was performed, followed by regular ALD deposition to complete the fill. However, in contrast to the prior method, by way of example without limitation in accordance with implementations of the disclosure, a method for gapfill may proceed by performing about ten cycles of ALD fill, followed by a 0.1-0.3 second inhibition, and then repeating the process about 60 to 100 times to achieve a complete filled structure.

As presently described, plasma inhibition can be utilized to control the depth of deposition in holes and trenches. The plasma inhibition lasts for multiple ALD cycles without the need to re-treat the surface. As a fluorine plasma has been described, it will be appreciated that any fluorine-containing precursor suitable for generating a fluorine plasma may be used, including by way of example without limitation, the following: $CH_3F$, $CHF_3$, $CF_4$, $C_2H_4F_2$, $C_2H_2F_4$, $C_3H_2F_6$, $C_4H_2F_8$, $C_4F_8$, $NF_3$, $SF_6$, etc. Additionally, while a fluorine plasma has been specifically described, it will be appreciated that other inhibitors can be used, including the following: $NH_3$, ethylene diamine, methylamine, dimethylamine, trimethylamine, t-butylamine, ethylamine, bis-diethylamine, trimethylamine, methanol, ethanol, propanol, isopropanol, ethane diol, alcoholamines, ethanolamine, etc.

FIGS. 6A, 6B, and 6C conceptually illustrate a cross-section of a feature on a substrate and demonstrate a gapfill process in accordance with implementations of the disclosure. As shown at FIG. 6A, a feature 600 is defined in a substrate. The feature 600 includes a reentrancy 602. In order to fill the feature 600, it is desirable to minimize or reduce growth above the reentrancy 602 while permitting growth up to and including the reentrancy 602. Thus, broadly speaking, as one descends the feature 600, the level at which the reentrancy 602 starts, as shown, defines a target inhibition level, so that growth above the target inhibition level is inhibited while the growth below the target inhibition level is permitted.

Accordingly, a gapfill procedure in accordance with implementations of the disclosure can be employed to fill the feature 600, including gapfill of the reentrancy 602, while avoiding pinch-off or void formation due to the reentrancy 602. That is, as shown at FIG. 6B, an ALD+inhibition treatment cycle can be tuned so that the ALD growth is inhibited above the reentrancy 602 while faster growth is permitted below and up to the reentrancy 602. It will be appreciated that each cycle includes multiple ALD cycles coupled with a single inhibition treatment. In some implementations, the gapfill process fills more slowly above the reentrancy, so that the reentrancy is filled before the region above the reentrancy is filled. The process enables complete gapfill of the feature 600 with no void, as shown at FIG. 6C.

FIGS. 7A to 7F illustrate a cross-section of a feature having multiple reentrancies, demonstrating a process for gapfill in accordance with implementations of the disclosure. As shown at FIG. 7A, the feature 700 includes a first reentrancy 702 that is positioned deep within the feature 700, and a second reentrancy 704 that is positioned towards the middle of the feature 700. The first reentrancy 702 defines a first inhibition target level, at which inhibition is targeted to permit growth up to and including the first reentrancy 702 while inhibiting growth above this level.

Thus, as shown at FIG. 7B, a first cycle of ALD+inhibition treatment is performed, targeting the first inhibition target level. Accordingly, the feature 700 is filled up to and including the first reentrancy 702, without forming a void, as illustrated at FIG. 7C.

Similar to that described with respect to the first reentrancy 702, the second reentrancy 704 also defines a second inhibition target level, at which inhibition is targeted to permit growth up to and including the second reentrancy 704 while inhibiting growth above this level.

Thus, as shown at FIG. 7D, a second cycle of ALD+inhibition treatment is performed, targeting the second inhibition target level. Accordingly, the feature 700 is filled up to and including the second reentrancy 704, without forming a void, as illustrated at FIG. 7E.

After fill of the first and second reentrancies is accomplished, then in some implementations, regular ALD is performed (without an inhibition treatment) to complete the gapfill of the feature 700 as demonstrated at FIG. 7F.

Deposition-etch-deposition (DED) (e.g. ALD oxide etch repeat) and inhibition (e.g. fluorine inhibition as described above) based deposition processes have been demonstrated to fill high aspect ratio vias, holes, and trenches, as described above. However, the DED/inhibition methods encounter throughput limitations due to existing hardware configurations when compared with standard ALD based growth techniques.

Hence in accordance with implementations of the disclosure, a hardware enhancement is combined with the DED/inhibition technique to fill high aspect ratio structures with re-entrant features, providing throughputs comparable or better than standard ALD fill processes. Overall throughput of ALD films grown under standard ALD process conditions is also improved. To achieve higher throughput, the combination of a new growth technique and new hardware is utilized. More specifically in terms of hardware, a new set of manifolds are employed to allow for fast cycle times of etch/inhibition/passivation gases. The etch/inhibition/passivation gases are utilized to re-shape/treat the surface to enable a gap free growth.

Figure 8:
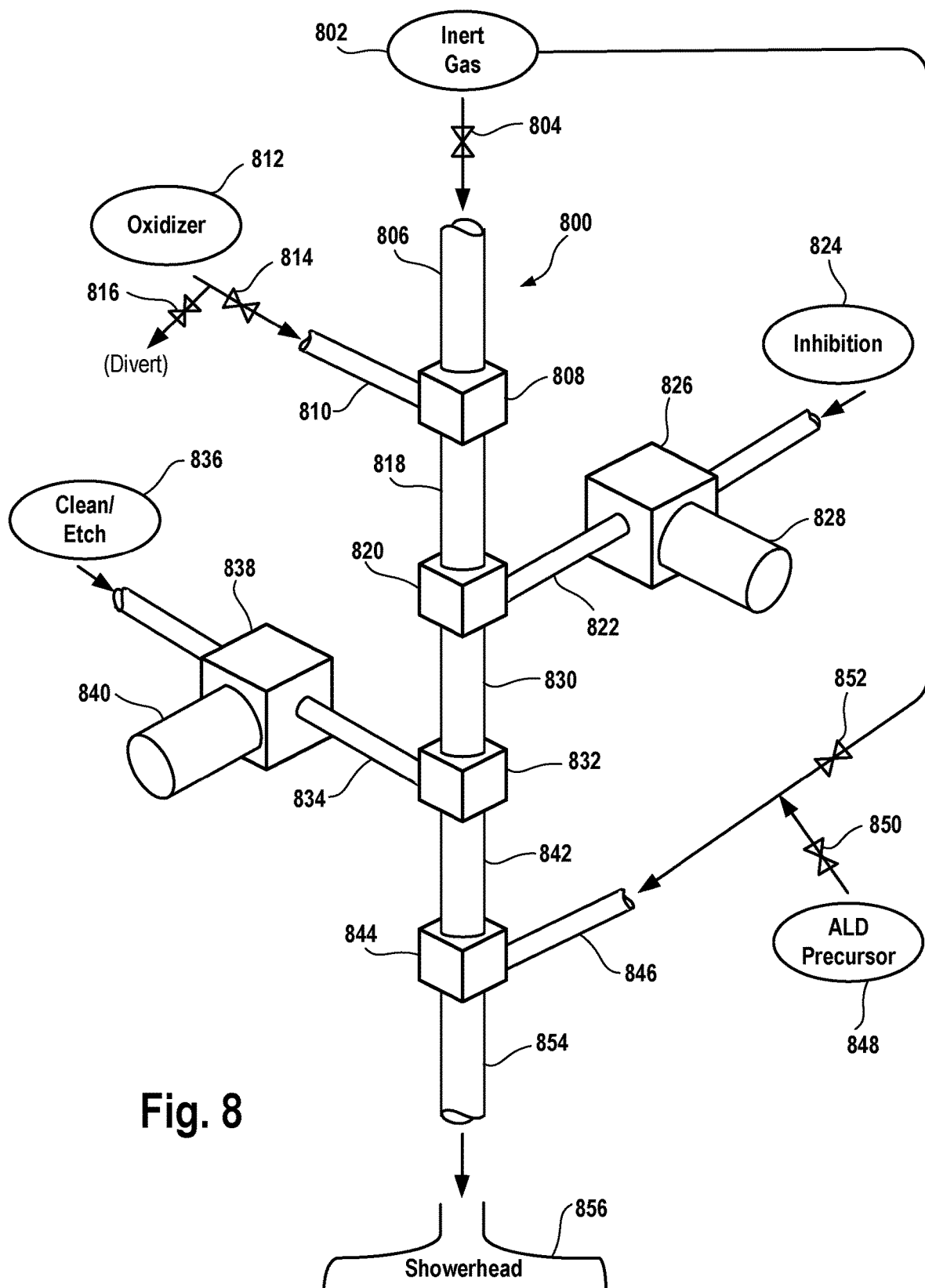
FIG. 8 illustrates a gas feed system for supplying process gases to a process chamber for an ALD process, in accordance with implementations of the disclosure.

FIG. 8 illustrates a gas feed system for supplying process gases to a process chamber for an ALD process, in accordance with implementations of the disclosure. A central gas feed 800 is configured to deliver process gases of the system to a showerhead 856. The central gas feed 800 is defined by several segments and manifolds that enable various gases to be provided to the showerhead 856, and thereby into the process chamber.

As shown, the central gas feed 800 includes a feed line 806 through which an inert gas 802 is provided to the central gas feed 800. The flow of the inert gas 802 into the central gas feed 800 may be controlled by a valve 804.

The central gas feed 800 further includes a manifold 808 that is configured to enable delivery of an oxidizer 812 into the central gas feed 800. The oxidizer 812 is delivered through a feed line 810 that connects to the manifold 808. Furthermore, the flow of the oxidizer into the manifold 808 may be controlled by a valve 814. Additionally, in some implementations, the oxidizer may be diverted through a valve 816 as shown.

A segment 818 connects between the manifold 808 and a manifold 820. The manifold 820 is configured to enable delivery of an inhibition or passivation gas 824 into the central gas feed 800. The inhibition/passivation gas 824 is delivered through a feed line 822 that connects to the manifold 820. The delivery of the inhibition/passivation gas 824 is controlled by a valve 826. In the illustrated implementation, an actuator 828 is configured to control the opening/closing of the valve 826.

A segment 830 connects between the manifold 820 and a manifold 832. The manifold 832 is configured to enable delivery of clean or etch gas 836 into the central gas feed 800. The clean/etch gas 836 is delivered through a feed line 834 that connects to the manifold 832. The delivery of the clean/etch gas 836 is controlled by a valve 838. In the illustrated implementation, an actuator 840 is configured to control the opening/closing of the valve 838.

A segment 842 connects between the manifold 832 and a manifold 844. The manifold 844 is configured to enable delivery of ALD precursor gas 848 into the central gas feed 800. The ALD precursor gas 848 is delivered through a feed line 846 that connects to the manifold 844. The delivery of the ALD precursor gas 848 is controlled by a valve 850. In the illustrated implementation, also, the inert gas 802 can be delivered through the feed line 846, as controlled by a valve 852. Such inert gas can be used to purge the feed line 846 of any remaining precursor after dosing of the ALD precursor.

A segment 854 connects to the manifold 844, and directs gases to a showerhead 856, which is configured to deliver process gases into the process chamber.

As shown, the inhibition/passivation gas and the clean/etch gas are provided through separate manifolds, both of which are wholly independent of the delivery of the ALD precursor gas 848 and the oxidizer 812.

Figure 9A:
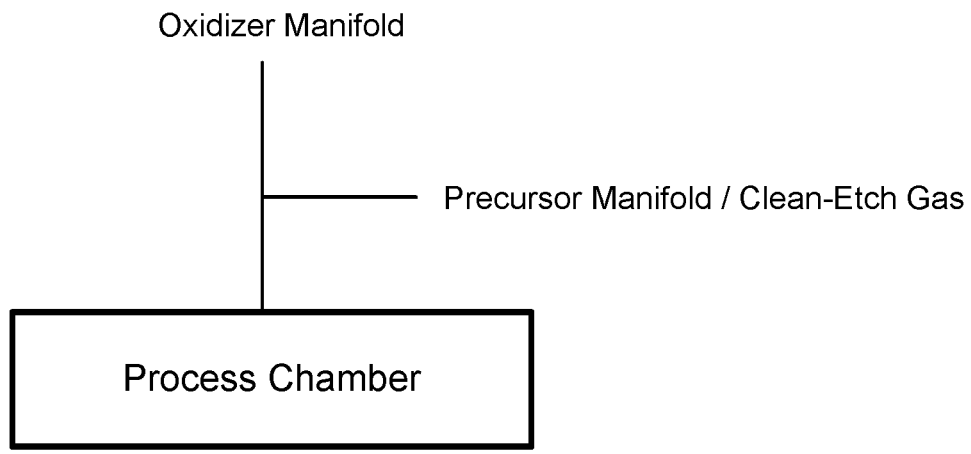
FIGS. 9A and 9B illustrate the difference between an existing system and a system with separate manifolds for delivery of inhibition/passivation gas and clean/etch gas, in accordance with implementations of the disclosure.
Figure 9B:
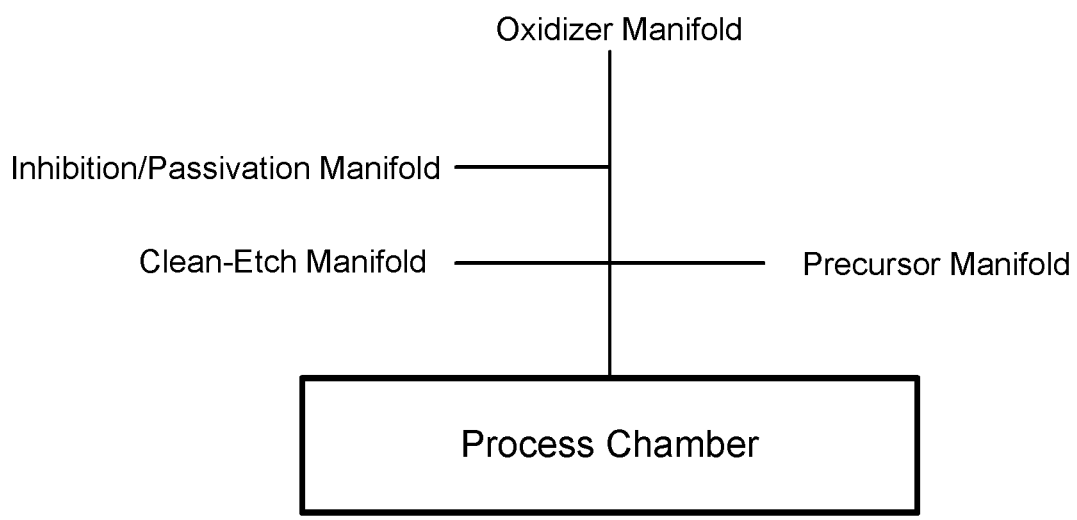

FIGS. 9A and 9B illustrate the difference between an existing system and a system with separate manifolds for delivery of inhibition/passivation gas and clean/etch gas.

FIG. 9A illustrates the configuration of an existing system. As shown, gas is delivered to the process chamber in two manifolds. Oxidizer (e.g. for the second dose step of the ALD process) is delivered through one manifold. However, deposition (ALD precursor) and etch/clean (e.g. fluorine-containing) gas are delivered through another manifold. Because the deposition and clean/etch gas share a manifold, this introduces delays in processing because of the need to flush out the precursor/clean-etch manifold when switching between deposition and etch-clean processes. For example, switching between an ALD precursor and a fluorine-containing gas may require a long purge that takes on the order of 100 to 300 seconds total time.

FIG. 9B illustrates the configuration of a system have independent manifolds for various process gases, in accordance with implementations of the disclosure. To overcome purge requirements, throughput is increased by utilizing independent inhibition, clean-etch, oxidizer and precursor manifolds. Long purge times (e.g. minutes) can be reduced to seconds, allowing for ALD-like dep-etch-inhibition/passivation cycle times.

For example, in the case of a fluorine-containing inhibition gas as previously described, the fluorine-containing gas can be provided through the clean-etch manifold, which is independent of the ALD precursor manifold, and therefore the previously required long purges are no longer required. Additionally, the system can accommodate usage of other inhibiting gases, which are also provided with a separate inhibition/passivation manifold for delivery as well.

Both of clean-etch and inhibition/passivation manifolds are independent of the ALD precursor manifold, and so the entire ALD process is independent of inhibition or fluorine treatment gas with respect to gas delivery. This speeds switching time for the various processes, enabling combinations of ALD, etch, and inhibition/passivation processes to be performed in rapid succession with minimal switching time, thereby improving throughput of the system.

Figure 10C:
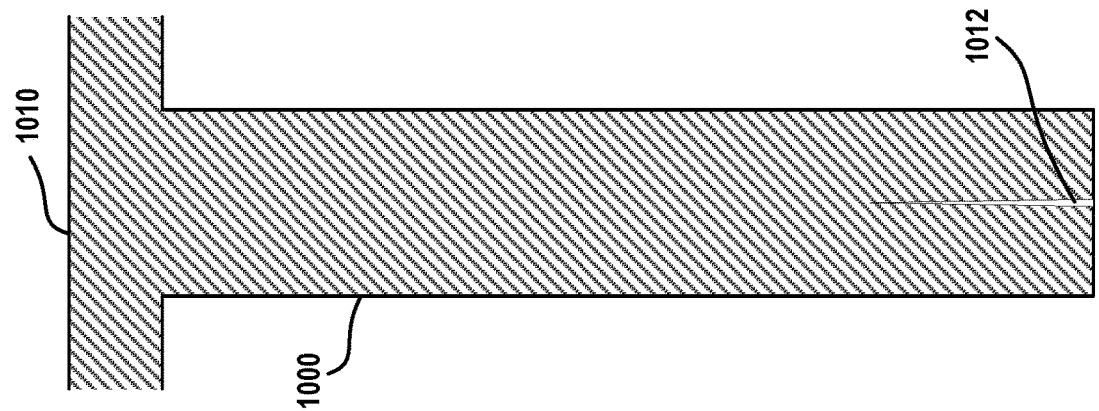
FIGS. 10A, 10B, and 10C illustrate the gap fill performance improvement that is possible utilizing techniques in accordance with implementations of the disclosure.
Figure 10B:
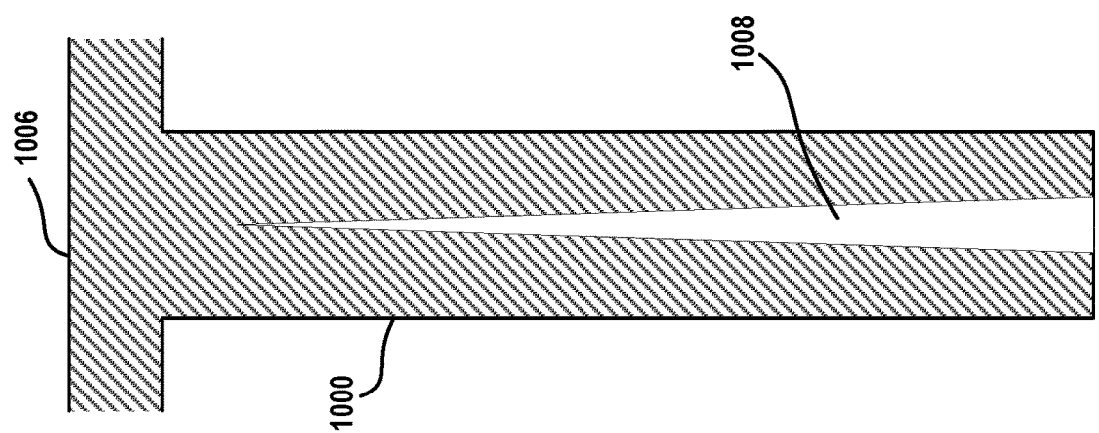
Figure 10A:
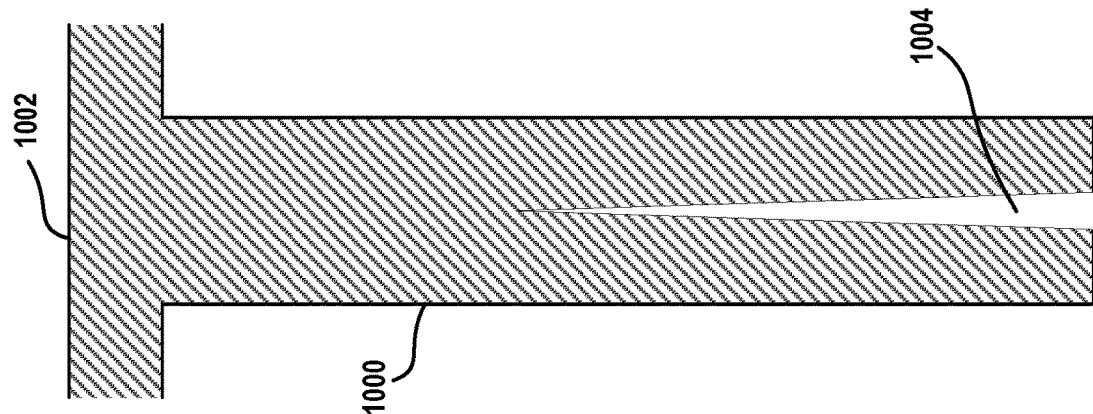

FIGS. 10A, 10B, and 10C illustrate the gap fill performance improvement that is possible utilizing techniques in accordance with implementations of the disclosure. FIG. 10A conceptually illustrates a cross-section of a feature 1000 following a gap fill process employing a standard ALD process, according to best known methods. The resulting gap fill 1002 can include a void 1004. Broadly speaking, it is desired to minimize such voids so that they are as deep as possible, but also such that gap fill deposition is performed as fast as possible. FIG. 10B illustrates gap fill of the feature 1000 using a high throughput ALD process, e.g. having a process time that is reduced to 0.3× that of the standard ALD process. However, as shown, the gap fill 1006 exhibits a worse result, with the void 1008 extending higher and wider than that of the standard ALD process. Though throughput is improved, gap fill performance is compromised.

However, FIG. 10C illustrates gap fill of the feature employing a DED process followed by a high throughput ALD process (e.g. DED to overcome reentrancy, followed by high throughput ALD to complete the fill), utilizing techniques and hardware in accordance with implementations of the disclosure. In the resulting gap fill 1010, a minimal void 1012 or no void at all is observed, and throughput is improved to a process time 0.5× that of standard ALD.

Figure 11:
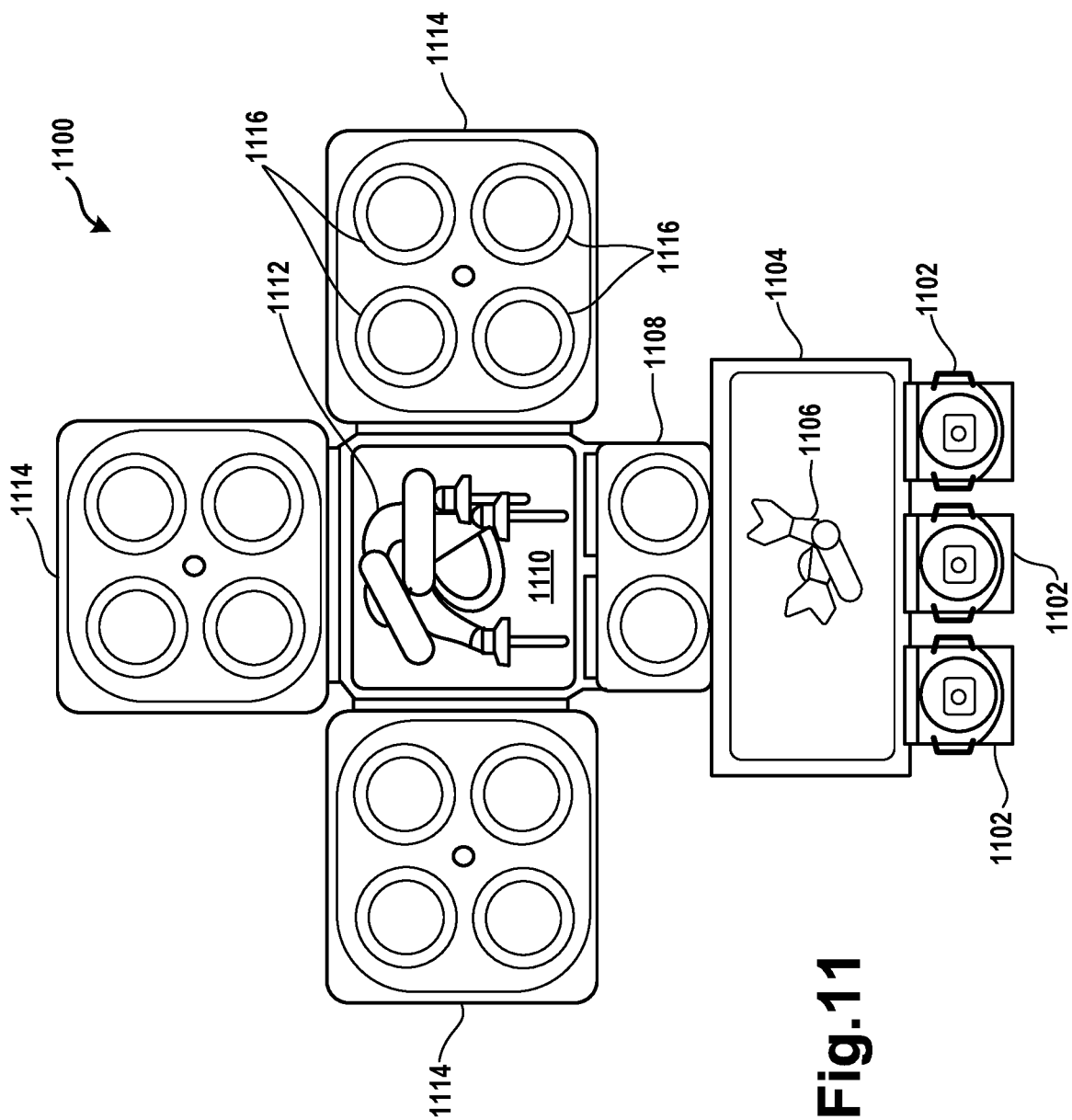
FIG. 11 illustrates a cluster tool system 1100 for processing substrates, in accordance with implementations of the disclosure.

FIG. 11 illustrates a cluster tool system 1100 for processing substrates, in accordance with implementations of the disclosure. The cluster tool system is typically installed in a fabrication facility. Transport containers 1102 (e.g. front opening unitary pods (FOUP's)) are utilized to bring substrates (e.g. wafers) to and from the cluster tool system. An equipment front end module (EFEM) 1104 includes a robot 1106 configured to transfer wafers between the transport modules 1102 and a loadlock 1108. A transfer module 1110 includes a robot 1112 configured to transfer wafers between the loadlock 1108 and one of several process tools 1114. In the illustrated implementation, each of the process tools 1114 is a multi-station process tool having multiple process stations 1116 to enable multiple wafers to be simultaneously processed. For example, in the illustrated implementation, each multi-station process tool 1114 has four process stations 1116 enabling four wafers to be simultaneously processed (e.g. performing an ALD process as described in accordance with implementations of the disclosure).

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
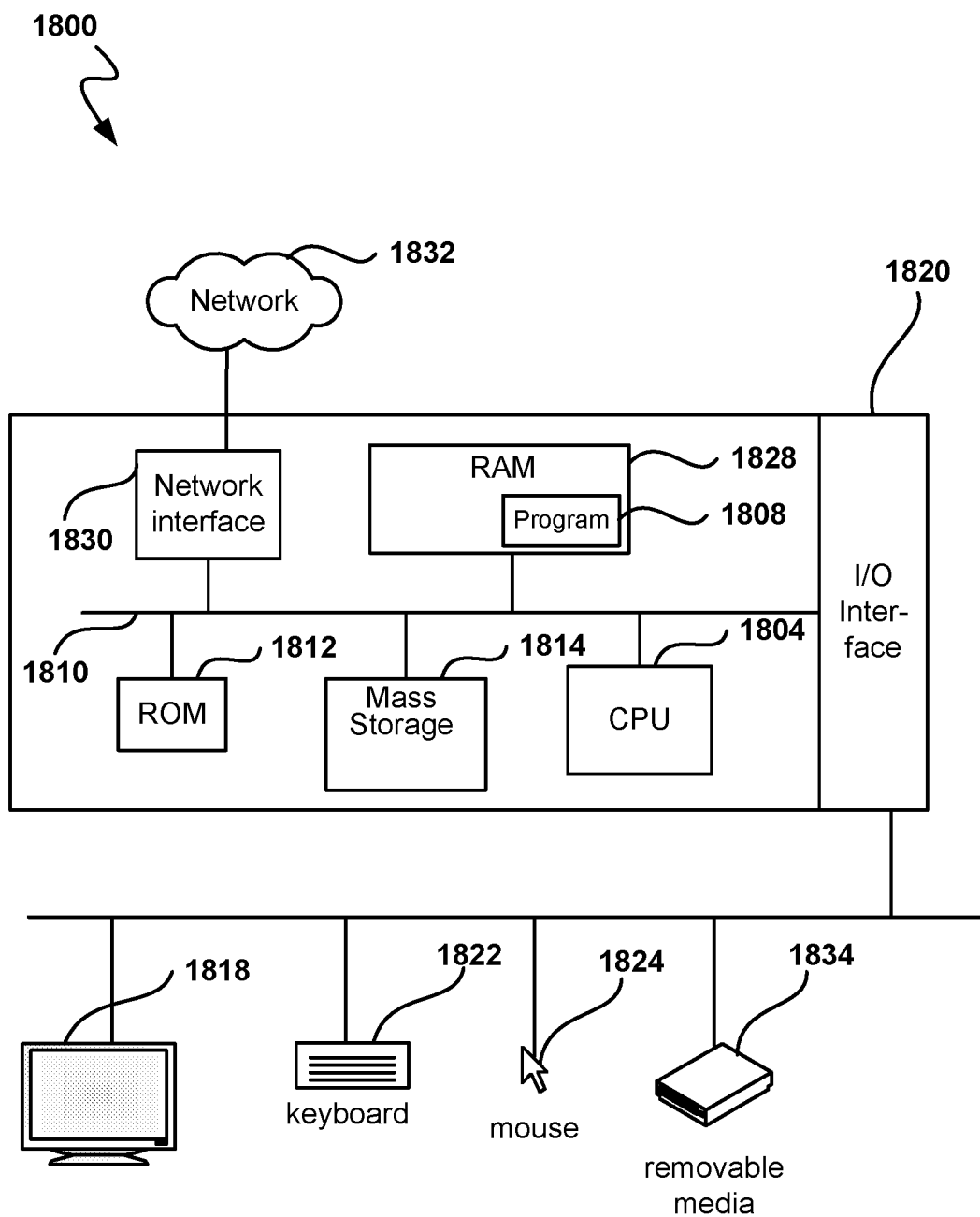
FIG. 12 is a simplified schematic diagram of a computer system for implementing implementations of the present disclosure.

FIG. 12 is a simplified schematic diagram of a computer system for implementing implementations of the present disclosure. It should be appreciated that the methods described herein may be performed with a digital processing system, such as a conventional, general-purpose computer system. Special purpose computers, which are designed or programmed to perform only one function may be used in the alternative. The computer system 1800 includes a central processing unit (CPU) 1804, which is coupled through bus 1810 to random access memory (RAM) 1828, read-only memory (ROM) 1812, and mass storage device 1814. System controller program 1808 resides in random access memory (RAM) 1828, but can also reside in mass storage 1814.

Mass storage device 1814 represents a persistent data storage device such as a floppy disc drive or a fixed disc drive, which may be local or remote. Network interface 1830 provides connections via network 1832, allowing communications with other devices. It should be appreciated that CPU 1804 may be embodied in a general-purpose processor, a special purpose processor, or a specially programmed logic device. Input/Output (I/O) interface 1820 provides communication with different peripherals and is connected with CPU 1804, RAM 1828, ROM 1812, and mass storage device 1814, through bus 1810. Sample peripherals include display 1818, keyboard 1822, cursor control 1824, removable media device 1834, etc.

Display 1818 is configured to display the user interfaces described herein. Keyboard 1822, cursor control (mouse) 1824, removable media device 1834, and other peripherals are coupled to I/O interface 1820 to communicate information in command selections to CPU 1804. It should be appreciated that data to and from external devices may be communicated through I/O interface 1820. The implementations can also be practiced in distributed computing environments where tasks are performed by remote processing devices that are linked through a wire-based or wireless network.

Implementations may be practiced with various computer system configurations including hand-held devices, microprocessor systems, microprocessor-based or programmable consumer electronics, minicomputers, mainframe computers and the like. The implementations can also be practiced in distributed computing environments where tasks are performed by remote processing devices that are linked through a network.

With the above implementations in mind, it should be understood that the implementations can employ various computer-implemented operations involving data stored in computer systems. These operations are those requiring physical manipulation of physical quantities. Any of the operations described herein that form part of the implementations are useful machine operations. The implementations also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more implementations can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Accordingly, the disclosure of the example implementations is intended to be illustrative, but not limiting, of the scope of the disclosures, which are set forth in the following claims and their equivalents. Although example implementations of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

What is claimed is:

1. A method for performing gap fill of a feature on a substrate, comprising:
   performing in order the following operations of;
   (a) moving the substrate into a process chamber;
   (b) performing, consecutively, a plurality of cycles of an atomic layer deposition process on the substrate in the process chamber;
   (c) purging process gases from the atomic layer deposition process from the process chamber;
   (d) performing a plasma treatment on the substrate by introducing a fluorine-containing gas into the process chamber and applying RF power to the fluorine-containing gas to generate a fluorine plasma in the process chamber;
   (e) purging process gases from the plasma treatment from the process chamber;
   (f) repeating, in order, operations (b) through (e) until a predefined plurality of cycles of operations (b) through (e) has been performed.

2. The method of claim 1, wherein the fluorine plasma passivates a portion of the feature on the substrate, thereby inhibiting deposition by the atomic layer deposition process over the portion of the feature that is passivated.

3. The method of claim 2, wherein the portion of the feature that is passivated extends from a top of the feature down to a predefined target level in the feature.

4. The method of claim 3, wherein the predefined target level is controlled by one or more parameters of the plasma treatment.

5. The method of claim 4, wherein the parameters of the plasma treatment include one or more of the following: a duration of the plasma treatment, a temperature of the plasma treatment, a pressure of the fluorine-containing gas, and a level of the RF power.

6. The method of claim 3, wherein the feature includes a reentrancy, and wherein the predefined target level is defined approximately at a level of the reentrancy, so that deposition by the atomic layer deposition process is substantially inhibited above the level of the reentrancy by the plasma treatment.

7. The method of claim 2, wherein the fluorine plasma passivates the portion of the feature by forming fluorine terminated species along surfaces of the portion of the feature.

8. The method of claim 1, further comprising:
   (g) performing one or more cycles of the atomic layer deposition process.

9. The method of claim 8, wherein the predefined number of cycles of operation (e) is configured to effect gap fill so as to remove a reentrancy in the feature.

10. The method of claim 9, wherein the one or more cycles of the atomic layer deposition process of operation (g) are configured to complete the gap fill of the feature.

11. The method of claim 1, wherein the atomic layer deposition process is configured to deposit an oxide in the feature of the substrate.

12. The method of claim 1, wherein the fluorine-containing gas is $CH_3F$, $CHF_3$, $CF_4$, $C_2H_4F_2$, $C_2H_2F_4$, $C_3H_2F_6$, $C_4H_2F_8$, $C_4F_8$, $NF_3$, or $SF_6$.

13. A method for performing gap fill of a feature on a substrate, comprising:
    performing in order the following operations of;
    (a) moving the substrate into a process chamber;
    (b) performing, consecutively, a plurality of cycles of an atomic layer deposition process on the substrate in the process chamber, the atomic layer deposition process being configured to deposit an oxide in the feature of the substrate;
    (c) purging process gases from the atomic layer deposition process from the process chamber;
    (d) performing a plasma treatment on the substrate by introducing a fluorine-containing gas into the process chamber and applying RF power to the fluorine-containing gas to generate a fluorine plasma in the process chamber;

(e) purging process gases from the plasma treatment from the process chamber;
(f) repeating, in order, operations (b) through (e) until a predefined plurality of cycles of operations (b) through (e) has been performed;
(g) performing a plurality of cycles of the atomic layer deposition process.

14. The method of claim 13, wherein the fluorine plasma passivates a portion of the feature on the substrate, thereby inhibiting deposition by the atomic layer deposition process over the portion of the feature that is passivated.

15. The method of claim 14, wherein the portion of the feature that is passivated extends from a top of the feature down to a predefined target level in the feature.

16. The method of claim 15, wherein the predefined target level is controlled by one or more parameters of the plasma treatment.

17. The method of claim 16, wherein the parameters of the plasma treatment include one or more of the following: a duration of the plasma treatment, a temperature of the plasma treatment, a pressure of the fluorine-containing gas, and a level of the RF power.

18. A method for performing gap fill of a feature on a substrate, comprising:
performing in order the following operations of;
(a) moving the substrate into a process chamber;
(b) performing, consecutively, a plurality of cycles of an atomic layer deposition process on the substrate in the process chamber;
(c) purging process gases from the atomic layer deposition process from the process chamber;
(d) performing a plasma treatment on the substrate by introducing a fluorine-containing gas into the process chamber and applying RF power to the fluorine-containing gas to generate a fluorine plasma in the process chamber, the RF power being applied at a frequency in the range of approximately 200 to 600 kHz;
(e) purging process gases from the plasma treatment from the process chamber;
(f) repeating, in order, operations (b) through (e) until a predefined plurality of cycles of operations (b) through (e) has been performed.

19. The method of claim 18, wherein a pressure of the plasma treatment is in the range of about 0.5 to 8 Torr.

20. The method of claim 18, wherein a duration of the plasma treatment is in the range of about 0.1 to 3 seconds.

* * * * *